United States Patent
Dunn et al.

(10) Patent No.: US 8,389,206 B2
(45) Date of Patent: Mar. 5, 2013

(54) HIGH NORMALITY SOLUTION FOR REMOVING FREEZE MATERIAL IN LITHOGRAPHIC APPLICATIONS

(75) Inventors: Shannon W. Dunn, Altamont, NY (US); Shinichiro Kawakami, Watervliet, NY (US); Dave Hetzer, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 480 days.

(21) Appl. No.: 12/564,738

(22) Filed: Sep. 22, 2009

(65) Prior Publication Data

US 2011/0070545 A1    Mar. 24, 2011

(51) Int. Cl.
*G03F 7/26* (2006.01)
(52) U.S. Cl. .......................................... 430/322
(58) Field of Classification Search .................. 430/322, 430/323, 325
See application file for complete search history.

(56) References Cited

U.S. PATENT DOCUMENTS

| 5,514,520 A * | 5/1996 | Thackeray et al. ...... 430/270.14 |
| 7,588,879 B2 | 9/2009 | Brodski et al. |
| 2004/0265747 A1 * | 12/2004 | Medeiros et al. ............. 430/313 |
| 2006/0275694 A1 * | 12/2006 | Bucchignano et al. .... 430/270.1 |
| 2008/0305638 A1 * | 12/2008 | Choi et al. .................... 438/700 |
| 2009/0053657 A1 * | 2/2009 | Hatakeyama et al. ........ 430/324 |

OTHER PUBLICATIONS

International Searching Authority, International Search Report and Written Opinion, International Application No. PCT/US2010/049056, Mailed Nov. 2, 2010, 7 pages.

Tradeshow booth display by Rohm & Haas, SPIE Advanced Lithography, Feb. 22-27, 2009, San Jose, CA, U.S.A. (Document posted @ http://www.rohmhaas.com/electronic_materials/tradeshow/SPIE09/docs/LithoExtensions.pdf).

* cited by examiner

*Primary Examiner* — Brittany Raymond
(74) *Attorney, Agent, or Firm* — Wood, Herron & Evans, LLP

(57) ABSTRACT

A method for patterning a substrate is described. The method comprises forming a layer of radiation-sensitive material on the substrate, preparing a pattern in the layer of radiation-sensitive material, and applying a chemical freeze layer over the layer of radiation-sensitive material to form a frozen layer of radiation-sensitive material. Thereafter, the method comprises stripping the chemical freeze layer using a high normality strip solution to preserve the pattern in the frozen layer of radiation-sensitive material, wherein the high normality strip solution contains an active solute having a normality (N) greater than 0.26.

18 Claims, 5 Drawing Sheets

HIGH NORMALITY SOLUTION FOR REMOVING FREEZE MATERIAL IN LITHOGRAPHIC APPLICATIONS

BACKGROUND OF THE INVENTION

1. Field of Invention

The present invention relates to a method for patterning a thin film on a substrate, and more particularly to a method for double patterning a thin film on a substrate using a chemical freeze material.

2. Description of Related Art

In material processing methodologies, pattern etching comprises the application of a thin layer of radiation-sensitive material, such as photo-resist, to an upper surface of a substrate that is subsequently patterned in order to provide a mask for transferring this pattern to the underlying thin film on a substrate during etching. The patterning of the radiation-sensitive material generally involves exposure by a radiation source through a reticle (and associated optics) of the radiation-sensitive material using, for example, a photo-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers.

More recently, a double patterning approach has been introduced to allow the patterning of smaller features at a smaller pitch than what is currently possible with standard lithographic techniques. One approach to reduce the feature size is to use standard lithographic pattern and etch techniques on the same substrate twice (i.e., LELE—Litho/Etch/Litho/Etch), thereby forming larger patterns spaced closely together to achieve a smaller feature size than would be possible by single exposure. During LELE double patterning, the substrate is exposed to a first pattern, the first pattern is developed in the radiation-sensitive material, the first pattern formed in the radiation-sensitive material is transferred to an underlying layer using an etching process, and then this series of steps is repeated for a second pattern.

Another approach to reduce the feature size is to use standard lithographic pattern on the same substrate twice followed by etch techniques (i.e., LLE—Litho/Litho/Etch), thereby forming larger patterns spaced closely together to achieve a smaller feature size than would be possible by single exposure. During LLE double patterning, the substrate is exposed to a first pattern, the substrate is exposed to a second pattern, the first pattern and the second pattern are developed in the radiation-sensitive material, and the first pattern and the second pattern formed in the radiation-sensitive material are transferred to an underlying layer using an etching process.

One approach to LLE double patterning includes a Litho/Freeze/Litho/Etch (LFLE) technique that utilizes an application of a freeze material on a first pattern in a first patterning layer to cause cross-linking therein, thus allowing the first patterning layer to withstand subsequent processing of a second patterning layer with a second pattern. However, conventional LFLE techniques suffer from poor throughput and unacceptable defectivity, among other things.

SUMMARY OF THE INVENTION

The invention relates to a method for patterning a thin film on a substrate.

The invention further relates to a method for double patterning a thin film on a substrate using a chemical freeze material.

According to one embodiment, a method for double patterning a substrate is described. The method comprises forming a first layer of radiation-sensitive material on the substrate, preparing a first pattern in the first layer of radiation-sensitive material, and applying a chemical freeze layer over the first layer of radiation-sensitive material to form a frozen first layer of radiation-sensitive material. The method further comprises stripping the chemical freeze layer using a high normality strip solution to preserve the first pattern in the frozen first layer of radiation-sensitive material, wherein the high normality strip solution contains an active solute having a normality (N) greater than 0.26. Thereafter, the method comprises forming a second layer of radiation-sensitive material on the substrate, and preparing a second pattern in the second layer of radiation-sensitive material.

According to another embodiment, a method for patterning a substrate is described. The method comprises forming a layer of radiation-sensitive material on the substrate, preparing a pattern in the layer of radiation-sensitive material, and applying a chemical freeze layer over the layer of radiation-sensitive material to form a frozen layer of radiation-sensitive material. Thereafter, the method comprises stripping the chemical freeze layer using a high normality strip solution to preserve the pattern in the frozen layer of radiation-sensitive material, wherein the high normality strip solution contains an active solute having a normality (N) greater than 0.26.

According to another embodiment, a method for removing a freeze layer from a substrate is described. The method comprises forming a layer of radiation-sensitive material on the substrate, applying a chemical freeze layer over the layer of radiation-sensitive material, and stripping the chemical freeze layer using a high normality strip solution containing an active solute. The method further comprises selecting a normality (N) of the active solute in the high normality strip solution in excess of 0.26 to reduce residue remaining on the substrate as a result of the stripping.

DETAILED DESCRIPTION OF SEVERAL EMBODIMENTS

Figure 1A:
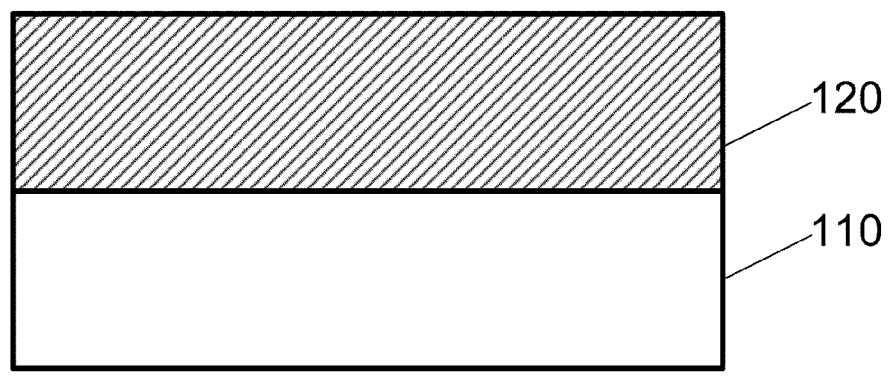
FIGS. 1A through 1G present a simplified schematic representation of a method of double patterning a substrate according to an embodiment.

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Referring now to the drawings, wherein like reference numerals designate identical or corresponding parts throughout the several views, FIGS. 1A through 1G, and FIG. 2 illustrate a method for double patterning a substrate according to an embodiment. The method is illustrated in a flow chart 200, and begins in 210 with forming a first layer of radiation-sensitive material 120 on a substrate 110. The first layer of radiation-sensitive material 120 may include a photo-resist. For example, the first layer of radiation-sensitive material 120 may comprise a 248 nm (nanometer) resist, a 193 nm resist, a 157 nm resist, an EUV (extreme ultraviolet) resist, or an electron beam sensitive resist. The first layer of radiation-sensitive material 120 may be formed by spin-coating the material onto substrate 110. The first layer of radiation-sensitive material 120 may be formed using a track system. For example, the track system can comprise a Clean Track ACT® 8, ACT® 12, or LITHIUS® resist coating and developing system commercially available from Tokyo Electron Limited (TEL). Other systems and methods for forming a photo-resist film on a substrate are well known to those skilled in the art of spin-on resist technology. The coating process may be followed by one or more first post-application bakes (PAB) to heat the substrate 110 and one or more cooling cycles, following the one or more first PABs, to cool the substrate 110.

Figure 1B:
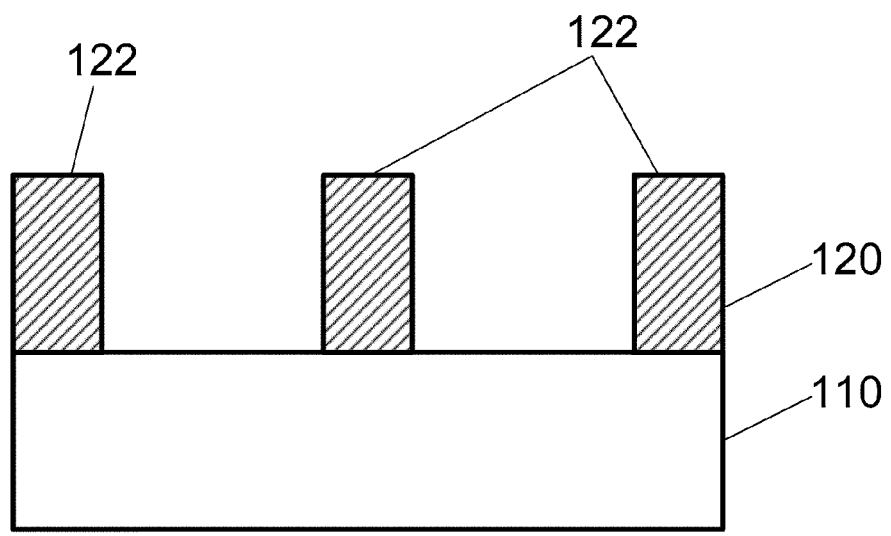

In 220 and as shown in FIG. 1B, the substrate 110 having the first layer of radiation-sensitive material 120 is aligned at a first alignment position in a radiation exposure system and imaged with first radiation having a first image pattern. The radiation exposure system may include a dry or wet photo-lithography system. The first image pattern may be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the first image pattern may be formed using an electron beam lithography system.

The first layer of radiation-sensitive material 120, having been exposed to the first image pattern, is subjected to a developing process in order to remove the first image pattern region, and form a first pattern 122 in the first layer of radiation-sensitive material 120. The developing process can include exposing the substrate to a developing solvent in a developing system, such as a track system. For example, the track system can comprise a Clean Track ACT® 8, ACT® 12, or LITHIUS® resist coating and developing system commercially available from Tokyo Electron Limited (TEL). The developing process may be preceded by one or more first post-exposure bakes (PEB) to heat the substrate 110 and one or more cooling cycles, following the one or more first PEBs, to cool the substrate 110.

Figure 1C:
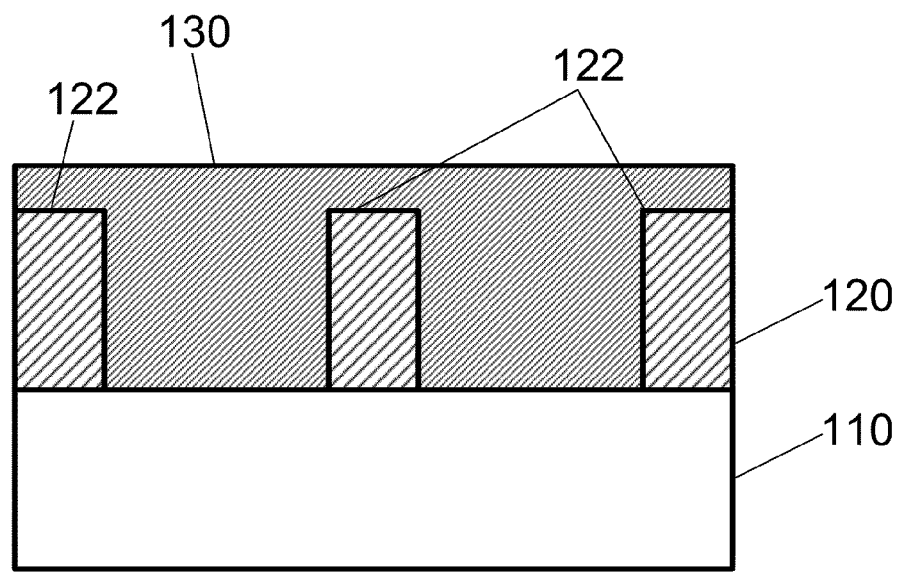

In 230 and as shown in FIG. 1C, a chemical freeze layer 130 is applied over the first layer of radiation-sensitive material 120 to form a frozen first layer of radiation-sensitive material 120'. The chemical freeze layer 130 may be formed by spin-coating the material onto substrate 110. The chemical freeze layer 130 may be formed using a track system. For example, the track system can comprise a Clean Track ACT® 8, ACT® 12, or LITHIUS® resist coating and developing system commercially available from Tokyo Electron Limited (TEL). Other systems and methods for forming a photo-resist film on a substrate are well known to those skilled in the art of spin-on resist technology. The coating process may be followed by one or more bake processes to heat substrate 110 and cure at least a portion of the chemical freeze layer 130.

Figure 1D:
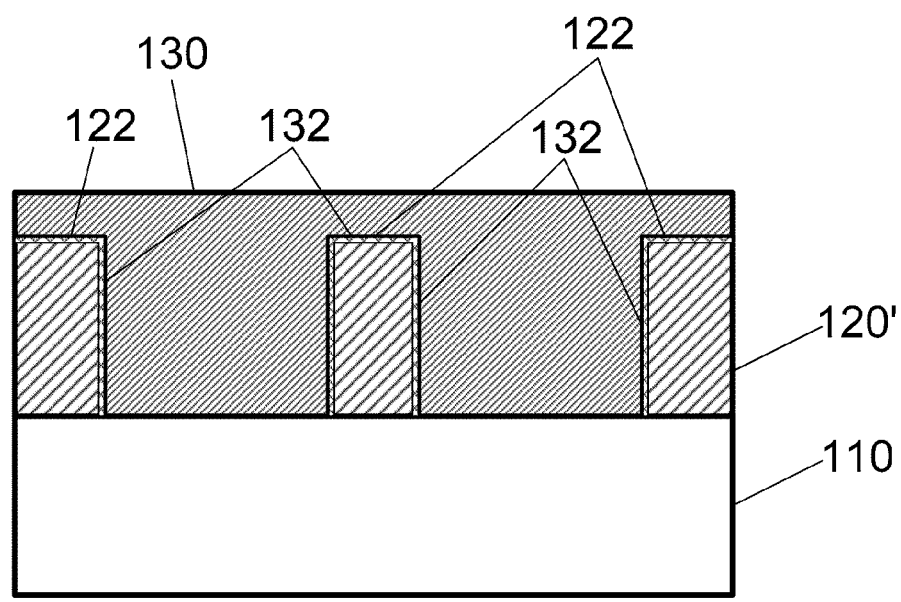

As a result of applying the chemical freeze layer 130 to substrate 110 and heating substrate 110, a portion of the chemical freeze layer 130 reacts with the exposed surface of the first layer of radiation-sensitive material 120 to form a protective layer 132; see FIG. 1D. The protective layer 132 protects the first layer of radiation-sensitive material 120 from subsequent coating, exposing, and developing processes, hence, "freezing" the first layer of radiation-sensitive material 120 to form the frozen first layer of radiation-sensitive material 120'.

The chemical freeze layer 130 may include any removable material that may cause cross-linking in a layer of radiation-sensitive material. The chemical freeze layer 130 may include a polymeric material. For example, the chemical freeze layer 130 may include a freeze material commercially available from JSR Micro, Inc. (1280 North Mathilda Avenue, Sunnyvale, Calif. 94089), including, for example, F112 freeze material. Alternatively, for example, the chemical freeze layer 130 may include a freeze material commercially available from Rohm and Haas, a wholly owned subsidiary of Dow Chemical Company (100 Independence Mall West, Philadelphia, Pa. 19106), including, for example, SC™ 1000 Surface Curing Agents (SCA).

Figure 1E:
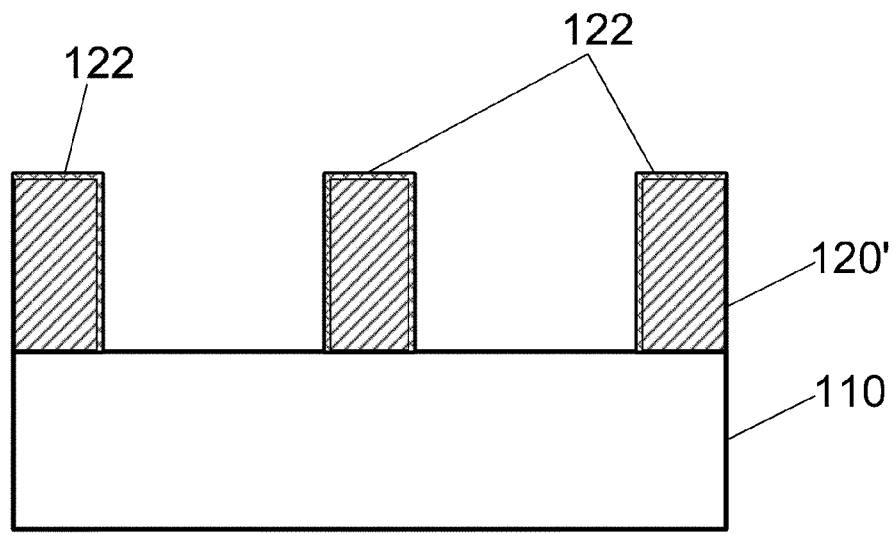

In 240 and as shown in FIG. 1E, the chemical freeze layer 130 is stripped from the substrate 110 using a high normality strip solution to preserve the first pattern 122 in the frozen first layer of radiation-sensitive material 120'. The high normality strip solution contains an active solute having a normality (N) greater than 0.26. Alternatively, the high normality strip solution contains an active solute having a normality (N) greater than 0.3. Alternatively, the high normality strip solution contains an active solute having a normality (N) greater than 0.4. Alternatively, the high normality strip solution contains an active solute having a normality (N) greater than 0.5.

The high normality strip solution may comprise an aqueous alkali solution. Additionally, the high normality strip solution may contain a hydroxide. Additionally, the high normality strip solution may contain a quaternary ammonium hydroxide. Furthermore, the high normality strip solution may include tetramethyl ammonium hydroxide (TMAH).

The normality (N) of TMAH in the high normality strip solution may be greater than 0.26. Alternatively, the normality (N) of TMAH in the high normality strip solution may be greater than or equal to 0.3. Alternatively, the normality (N) of TMAH in the high normality strip solution may be greater than or equal to 0.4. Alternatively, the normality (N) of TMAH in the high normality strip solution may be greater than or equal to 0.5. Alternatively yet, the normality (N) of TMAH in the high normality strip solution may be about 0.32.

The concentration of TMAH in the high normality strip solution may be greater than 2.36% w/v (or 2.36 grams of solute per 100 milliliters (ml) of solution). Alternatively, the concentration of TMAH in the high normality strip solution may be greater than 2.72% w/v (or 2.72 grams of solute per 100 milliliters (ml) of solution).

Conventional strip solutions have a normality (N) of 0.26 or less. For example, TMAH-based strip solutions are readily available from a commercial vendor with a normality of 0.26. As will be described below, the increase of the normality (N) in excess of 0.26 leads to an increase in substrate throughput for the double patterning process and a decrease in substrate defectivity which affects device yield.

Figure 1F:
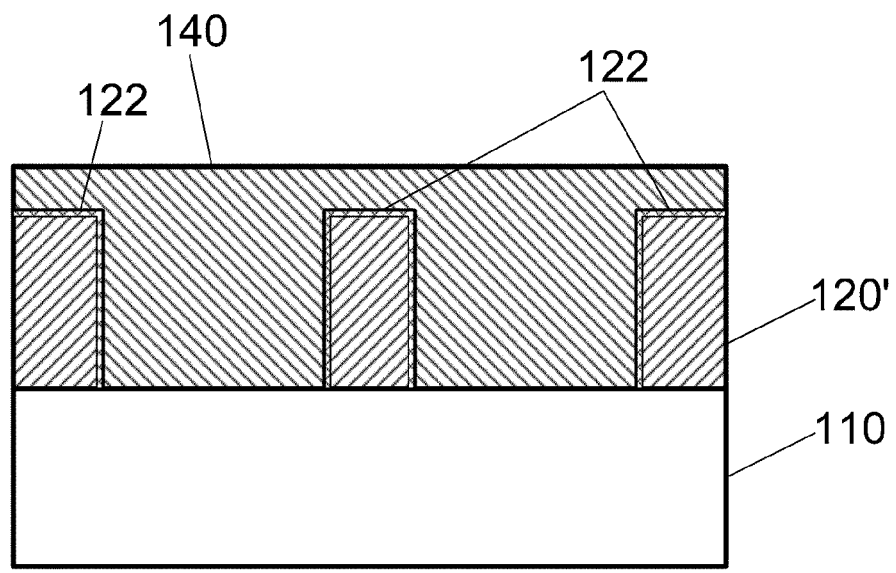

In 250 and as shown in FIG. 1F, a second layer of radiation-sensitive material 140 is formed on substrate 110. The second layer of radiation-sensitive material 140 may include a photo-resist. For example, the second layer of radiation-sensitive material 140 may comprise a 248 nm (nanometer) resist, a 193 nm resist, a 157 nm resist, an EUV (extreme ultraviolet) resists, or an electron beam sensitive resist. The second layer of radiation-sensitive material 140 may be formed by spin-coating the material onto substrate 110. The second layer of radiation-sensitive material 140 may be formed using a track system. For example, the track system can comprise a Clean Track ACT® 8, ACT® 12, or LITHIUS® resist coating and developing system commercially available from Tokyo Electron Limited (TEL). Other systems and methods for forming a photo-resist film on a substrate are well known to those skilled in the art of spin-on resist technology. The coating process may be followed by one or more first post-application bakes (PAB) to heat the substrate 110 and one or more cooling cycles, following the one or more first PABs, to cool the substrate 110.

Figure 1G:
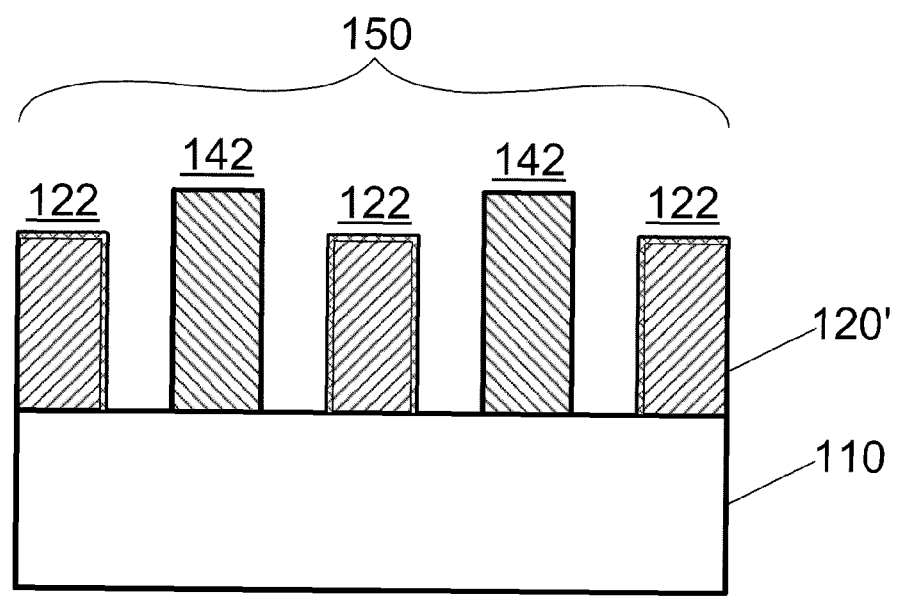
Figure 2:
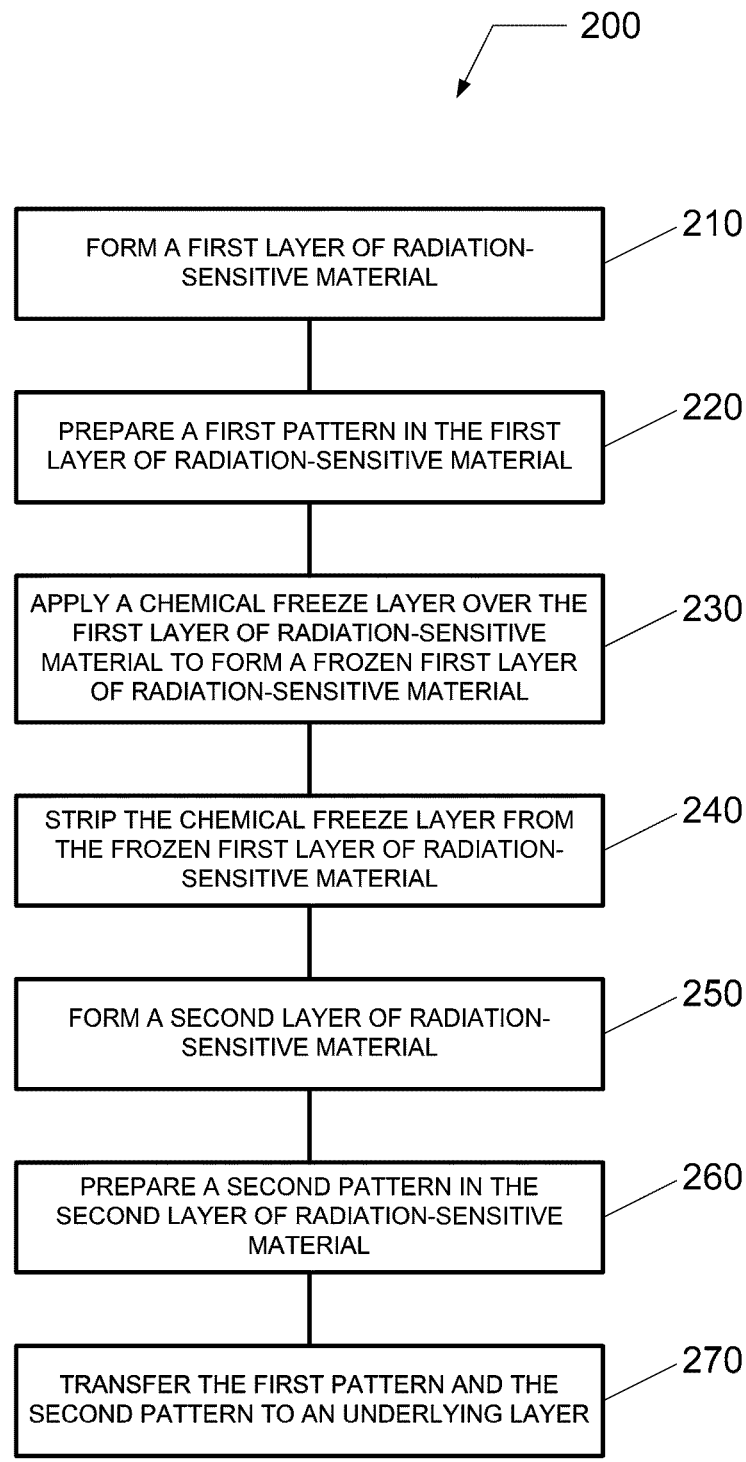
FIG. 2 illustrates a method of double patterning a substrate according to another embodiment.

In 260 and as shown in FIG. 1G, the substrate 110 having the second layer of radiation-sensitive material 140 is aligned at a second alignment position in a radiation exposure system and imaged with second radiation having a second image pattern. The second radiation may be the same as the first radiation or different than the first radiation. The radiation exposure system may include a dry or wet photo-lithography system. The second image pattern may be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the second image pattern may be formed using an electron beam lithography system.

The second layer of radiation-sensitive material 140, having been exposed to the second image pattern, is subjected to a developing process in order to remove the second image pattern region, and form a second pattern 142 in the second layer of radiation-sensitive material 140, thus leaving behind a double pattern 150 having the first pattern 122 and the second pattern 142. The developing process can include exposing the substrate to a developing solvent in a developing system, such as a track system. For example, the track system can comprise a Clean Track ACT® 8, ACT® 12, or LITHIUS® resist coating and developing system commercially available from Tokyo Electron Limited (TEL). The developing process may be preceded by one or more first post-exposure bakes (PEB) to heat the substrate 110 and one or more cooling cycles, following the one or more first PEBs, to cool the substrate 110.

In 270, the double pattern 150 is transferred to an underlying layer of the substrate 110 using one or more etching processes. The one or more etching processes may include any combination of wet or dry etching processes. The dry etching processes may include dry plasma etching processes or dry non-plasma etching processes.

Although the use of a chemical freeze material and the removal thereof has been described in the context of a double patterning scheme, a chemical freeze material and the removal methods described above may be used in a single patterning scheme and/or with other structures where it is desirable to apply a freeze material, react the freeze material with an underlying layer/structure to form a protective layer, and strip the freeze material to leave behind the underlying layer/structure with the protective layer.

According to an example, results are provided for a patterning process utilizing a chemical freeze material to preserve a pattern formed in a layer of radiation-sensitive material. The chemical freeze material included a freeze material commercially offered by JSR Micro, Inc. and marketed by the name F112. A first strip solution included a conventional aqueous 0.26 N TMAH solution, which is readily available from a commercial vendor. A second strip solution included an aqueous 0.32 N TMAH solution, which is not readily available from a commercial vendor. After the application of the chemical freeze material, the chemical freeze material is stripped using the identified strip solutions.

TABLE 1

| | DEFECT COUNT | | | |
| --- | --- | --- | --- | --- |
| STRIP SOLUTION COMPOSITION | Non-Visual Defect Count | Residue Polymer (RP) Defect Count | Total Defect Counts | % RP Defect Count to Total |
| 0.26N TMAH Solution | 149 | 102 | 261 | 39.1 |
| 0.32N TMAH Solution | 141 | 55 | 224 | 24.6 |

Table 1 presents the defect count as a function of the strip solution composition. Defect count is provided for non-visual defects and residue polymer (RP) defects. Additionally, the total defect count and the percent (%) fraction of residue polymer defects to total defects are provided. As shown in Table 1, residue polymer defect count decreased by 46% when the normality of the TMAH solution was increased from 0.26 to 0.32. Additionally, the substrate throughput was increased by 50% when the normality of the TMAH solution was increased from 0.26 to 0.32. The inventors suspect that the higher normality strip solution has a greater capacity to retain dissolved chemical freeze material in solution, thus, reducing defectivity arising from residue polymer. Additionally, the inventors suspect that the higher normality strip solution facilitates a higher strip rate of the chemical freeze material, hence, increasing the substrate throughput.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for double patterning a substrate, comprising:
   forming a first layer of radiation-sensitive material on said substrate;
   imaging and developing a first pattern in said first layer of radiation-sensitive material;
   applying a chemical freeze layer over said first layer of radiation-sensitive material to form a frozen first layer of radiation-sensitive material;
   stripping said chemical freeze layer using a high normality strip solution to preserve said first pattern in said frozen first layer of radiation-sensitive material, wherein said high normality strip solution contains an active solute having a normality (N) greater than 0.3;
   forming a second layer of radiation-sensitive material on said substrate; and
   imaging and developing a second pattern in said second layer of radiation-sensitive material.

2. The method of claim 1, wherein said normality (N) of said high normality strip solution is greater than or equal to 0.4.

3. The method of claim 1, wherein said normality (N) of said high normality strip solution is greater than or equal to 0.5.

4. The method of claim 1, further comprising: transferring said first pattern and said second pattern to an underlying layer using one or more etching processes.

5. The method of claim 1, wherein said forming said first layer of radiation-sensitive material comprises spin-coating said substrate with photo-resist, and wherein said forming said second layer of radiation-sensitive material comprises spin-coating said substrate with photo-resist.

6. The method of claim 1, wherein said imaging and developing said first pattern in said first layer of radiation-sensitive material comprises:
   aligning said substrate at a first alignment position in a radiation exposure system;
   exposing said first layer of radiation-sensitive material to first radiation;
   performing a first post-exposure bake of said first layer of radiation-sensitive material;
   cooling said substrate following said first post-exposure bake; and
   developing said first layer of radiation-sensitive material to form said first pattern therein.

7. The method of claim 1, wherein said imaging and developing said second pattern in said second layer of radiation-sensitive material comprises:
   aligning said substrate at a second alignment position in a radiation exposure system;
   exposing said second layer of radiation-sensitive material to second radiation;
   performing a second post-exposure bake of said second layer of radiation-sensitive material;
   cooling said substrate following said second post-exposure bake; and
   developing said second layer of radiation-sensitive material to form said second pattern therein.

8. The method of claim 1, wherein said applying said chemical freeze layer over said first layer of radiation-sensitive material comprises:
   spin-coating said substrate with said chemical freeze layer; and
   heating said substrate.

9. The method of claim 1, wherein said high normality strip solution comprises an aqueous alkali solution.

10. The method of claim 1, wherein said active solute in said high normality strip solution contains a hydroxide.

11. The method of claim 1, wherein said active solute in said high normality strip solution contains a quaternary ammonium hydroxide.

12. The method of claim 1, wherein said active solute in said high normality strip solution contains tetramethyl ammonium hydroxide (TMAH).

13. The method of claim 12, wherein said normality (N) of said active solute in said high normality strip solution is about equal to 0.32.

14. The method of claim 12, wherein a concentration of said TMAH in said high normality strip solution is greater than 2.36% w/v.

15. The method of claim 12, wherein a concentration of said TMAH in said high normality strip solution is greater than or equal to 2.72% w/v.

16. The method of claim 12, further comprising:
   selecting a concentration of said active solute in said high normality strip solution such that a 30% or greater reduction in residual polymer defect count on said substrate is achieved relative to a 0.26 N standard strip solution.

17. A method for patterning a substrate, comprising:
   forming a layer of radiation-sensitive material on said substrate;
   imaging and developing a pattern in said layer of radiation-sensitive material;
   applying a chemical freeze layer over said layer of radiation-sensitive material to form a frozen layer of radiation-sensitive material; and
   stripping said chemical freeze layer using a high normality strip solution to preserve said pattern in said frozen layer of radiation-sensitive material, wherein said high normality strip solution contains an active solute having a normality (N) greater than 0.3.

18. A method for removing a freeze layer from a substrate, comprising:
   forming a patterned layer of radiation-sensitive material on said substrate;
   applying a chemical freeze layer over said patterned layer of radiation-sensitive material;
   stripping said chemical freeze layer using a high normality strip solution containing an active solute; and
   selecting a normality (N) of said active solute in said high normality strip solution in greater than 0.3 to reduce residue remaining on said substrate as a result of said stripping.

* * * * *